United States Patent
Park et al.

(10) Patent No.: US 7,855,431 B2
(45) Date of Patent: Dec. 21, 2010

(54) CAPACITOR UNIT AND METHOD OF FORMING THE SAME

(75) Inventors: Jung-Min Park, Ansan-si (KR); Seok-Jun Won, Seoul (KR); Min-Woo Song, Seongnam-si (KR); Weon-Hong Kim, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 428 days.

(21) Appl. No.: 12/106,830

(22) Filed: Apr. 21, 2008

(65) Prior Publication Data
US 2008/0265371 A1 Oct. 30, 2008

(30) Foreign Application Priority Data
Apr. 26, 2007 (KR) ............... 10-2007-0040611

(51) Int. Cl.
*H01L 21/02* (2006.01)
(52) U.S. Cl. .................. 257/532; 438/957
(58) Field of Classification Search .......... 257/532; 438/957
See application file for complete search history.

(56) References Cited

U.S. PATENT DOCUMENTS 4,731,696 A * 3/1988 Himes et al. ............... 361/313
5,208,597 A * 5/1993 Early et al. ................. 341/172
6,069,050 A * 5/2000 Hou et al. .................. 438/393

FOREIGN PATENT DOCUMENTS

| KR | 10-0480603 | 3/2005 |
| KR | 1020060072752 | 6/2006 |
| KR | 10-0642752 | 10/2006 |
| KR | 1020060110551 | 10/2006 |

OTHER PUBLICATIONS

English Abstract for Publication No. 10-0480603.
English Abstract for Publication No. 1020060072752.
English Abstract for Publication No. 1020060110551.
English Abstract for Publication No. 10-0642752.

* cited by examiner

*Primary Examiner*—Douglas M Menz
(74) *Attorney, Agent, or Firm*—F. Chau & Associates, LLC

(57) ABSTRACT

A capacitor unit includes a first capacitor and a second capacitor. The first capacitor includes a first lower electrode, a first dielectric layer pattern and a first upper electrode sequentially stacked. The first capacitor includes a first control layer pattern for controlling a voltage coefficient of capacitance (VCC) of the first capacitor between the first lower electrode and the first dielectric layer pattern. The second capacitor includes a second lower electrode, a second dielectric layer pattern and a second upper electrode sequentially stacked. The second lower electrode is electrically connected to the first upper electrode, and the second upper electrode is electrically connected to the second lower electrode. The second capacitor includes a second control layer pattern for controlling a VCC of the second capacitor between the second lower electrode and the second dielectric layer pattern.

20 Claims, 10 Drawing Sheets

CAPACITOR UNIT AND METHOD OF FORMING THE SAME

CROSS-REFERENCE TO RELATED APPLICATIONS

This application claims priority under 35 U.S.C. §119 to Korean Patent Application No. 10-2007-0040611, filed on Apr. 26, 2007 in the Korean Intellectual Property Office (KIPO), the contents of which are herein incorporated by reference in their entirety.

BACKGROUND OF THE INVENTION

1. Technical Field

The present invention relates to a capacitor unit and more particularly, to a capacitor unit and a method of forming the same.

2. Discussion of the Related Art

The size of digital circuits incorporated into systems-on-chip (SOCs) has rapidly decreased; however, the size of analog circuits has not decreased very much. This is in large part attributable to the inability to substantially reduce the size of passive elements such as capacitors. Thus reducing the size of capacitors is important to achieve a high degree of integration in a semiconductor device.

The capacitance of a capacitor is proportional to a dielectric constant (k) and an area of a dielectric layer. Accordingly, when designing a capacitor with a desired capacitance, a dielectric material having a high k may be used to produce a smaller capacitor.

However, when the high-k dielectric material is used for the dielectric layer, a voltage coefficient of capacitance (VCC) may increase.

Referring to FIGS. 1A and 1B, when a first dielectric layer is formed using a high-k dielectric material such as hafnium oxide, hafnium carbon oxynitride and hafnium oxide (see FIG. 1A), a normalized capacitance of a capacitor having the first dielectric layer is more widely varied than that of a capacitor having a second dielectric layer including a low-k dielectric material such as silicon nitride, as the voltage applied to the capacitor is increased.

Particularly, when a capacitor has a polysilicon-insulator-polysilicon (PIP) structure, impurities are implanted into the polysilicon layer in order to decrease a VCC of the capacitor. Additionally, even the polysilicon layer doped with the impurities has a depletion area, so that the VCC may not be sufficiently decreased. Thus, the capacitor having the PIP structure is not suitable for an analog capacitor, which is employed in an analog-to-digital converter (ADC), a radio frequency (RF) device, a complementary metal-oxide semiconductor (CMOS) image sensor (CIS), etc. Accordingly, a capacitor having a metal-insulator-metal (MIM) structure has been used.

The capacitor having the MIM structure does not have a depletion area, and therefore the capacitor has a VCC smaller than that of the capacitor having the PIP structure. However, even the capacitor having the MIM structure does not have a sufficiently small VCC, and reducing the VCC may be needed in order to serve as an analog capacitor having high precision.

A capacitance of a capacitor and a voltage applied to the capacitor may be represented by Equation 1.

$$C = C_0(aV^2 + bV + 1) \quad \text{[Equation 1]}$$

Here, C refers to a capacitance of a capacitor, and $C_0$ indicates the capacitance of the capacitor when a voltage has not been applied thereto.

Referring to Equation 1, the VCC depends on the first coefficient "a" related to the square of a voltage V and the second coefficient "b" related to the voltage V. Thus, the first and second coefficients are decreased in order to decrease the VCC.

SUMMARY OF THE INVENTION

Exemplary embodiments of the present invention provide a capacitor unit having a small voltage coefficient of capacitance (VCC) and a large capacitance.

Exemplary embodiments of the present invention provide a method of forming a capacitor unit having a small VCC and a large capacitance.

According to one aspect of the present invention, a capacitor unit is provided. The capacitor unit includes a first capacitor and a second capacitor. In the first capacitor, a first lower electrode, a first dielectric layer pattern and a first upper electrode are sequentially stacked. The first capacitor includes a first control layer pattern for controlling a VCC of the first capacitor. The first control layer pattern is formed between the first lower electrode and the first dielectric layer pattern. In the second capacitor, a second lower electrode, a second dielectric layer pattern and a second upper electrode are sequentially stacked. The second lower electrode is electrically connected to the first upper electrode, and the second upper electrode is electrically connected to the second lower electrode. The second capacitor includes a second control layer pattern for controlling a VCC of the second capacitor. The second control layer pattern is formed between the second lower electrode and the second dielectric layer pattern.

In an exemplary embodiment of the present invention, the first and second lower electrodes may include metal or metal nitride, and the first and second control layer patterns may include metal oxide or metal oxynitride.

In an exemplary embodiment of the present invention, the first and second lower electrodes may include titanium oxide, tantalum oxide, ruthenium oxide, tungsten oxide, titanium tungsten oxide, titanium oxynitride, titanium aluminum oxynitride, tantalum oxynitride, ruthenium oxynitride, tungsten oxynitride, etc.

In an exemplary embodiment of the present invention, the first and second control layer patterns may include a metal or a metal nitride, and the first and second control layer patterns may include a metal oxide or a metal oxynitride.

In an exemplary embodiment of the present invention, the first and second dielectric layer patterns may have a multi-layer structure in which a hafnium oxide layer, a hafnium carbon oxide layer and a hafnium oxide layer are sequentially stacked.

In an exemplary embodiment of the present invention, the first and second dielectric layer patterns may have a multi-layer structure in which a hafnium oxide layer, a hafnium carbon oxynitride layer and a hafnium oxide layer are sequentially stacked.

According to another aspect of the present invention, a capacitor unit is provided. The capacitor unit includes a plurality of capacitor sets, each of which includes a first capacitor and a second capacitor. In the first capacitor, a first lower electrode, a first dielectric layer pattern and a first upper electrode are sequentially stacked. The first capacitor includes a first control layer pattern for controlling a VCC of the first capacitor. The first control layer pattern is formed between the first lower electrode and the first dielectric layer pattern. In the second capacitor, a second lower electrode, a second dielectric layer pattern and a second upper electrode are sequentially stacked. The second lower electrode is electrically connected to the first upper electrode, and the second upper electrode is electrically connected to the second lower electrode. The second capacitor includes a second control layer pattern for controlling a VCC of the second capacitor. The second control layer pattern is formed between the second lower electrode and the second dielectric layer pattern. Some of the first upper electrodes and some of the second lower electrodes that are not grounded are electrically connected to each other.

In an exemplary embodiment of the present invention, the first and second lower electrodes may include metal or metal nitride, and the first and second control layer patterns may include metal oxide or metal oxynitride.

In an exemplary embodiment of the present invention, the first and second lower electrodes may include titanium oxide, tantalum oxide, ruthenium oxide, tungsten oxide, titanium tungsten oxide, titanium oxynitride, titanium aluminum oxynitride, tantalum oxynitride, ruthenium oxynitride, tungsten oxynitride, etc.

In an exemplary embodiment of the present invention, the first and second control layer patterns may include a metal or a metal nitride, and the first and second control layer patterns may include a metal oxide or a metal oxynitride.

In an exemplary embodiment of the present invention, the first and second dielectric layer patterns may have a multilayer structure in which a hafnium oxide layer, a hafnium carbon oxide layer and a hafnium oxide layer are sequentially stacked.

In an exemplary embodiment of the present invention, the first and second dielectric layer patterns may have a multilayer structure in which a hafnium oxide layer, a hafnium carbon oxynitride layer and a hafnium oxide layer are sequentially stacked.

According to an aspect of the present invention, a method of forming a capacitor unit is provided. In the method of forming the capacitor unit, first and second lower electrodes are formed on a substrate. First and second control layer patterns for controlling a VCC of the capacitor are formed on the first and second lower electrodes. First and second dielectric layer patterns are formed on the first and second control layer patterns. First and second upper electrodes are formed on the first and second dielectric layer patterns. A first wiring electrically connecting the first upper electrode to the second lower electrode, and a second wiring electrically connecting the first lower electrode to the second upper electrode are formed.

In an exemplary embodiment of the present invention, when the first and second control layer patterns are formed, an oxidation process may be performed on the first and second lower electrodes.

In an exemplary embodiment of the present invention, the oxidation process may include a plasma treatment under an oxygen, ozone or nitrous oxide atmosphere.

In an exemplary embodiment of the present invention, the plasma treatment may be performed at a temperature below about 475° C. within about 5 minutes.

In an exemplary embodiment of the present invention, the oxidation process may include an annealing under an oxygen, ozone or nitrous oxide atmosphere.

In an exemplary embodiment of the present invention, the annealing may be performed at a temperature below about 475° C. within about 5 minutes.

In an exemplary embodiment of the present invention, the dielectric layer patterns may be formed by an atomic layer deposition (ALD) process, a plasma-enhanced atomic layer deposition (PEALD) process or a chemical vapor deposition (CVD) process.

In an exemplary embodiment of the present invention, a voltage may be applied to the first wiring and the second wiring may be grounded.

According to exemplary embodiments of the present invention, a VCC of a capacitor may have a reduced first coefficient by forming a control layer pattern on a lower electrode, and a reduced second coefficient by connecting a plurality of capacitors in series. Thus, a capacitor having a small VCC may be formed. The control layer pattern may be formed by oxidizing the lower electrode.

BRIEF DESCRIPTION OF THE DRAWINGS

The above and other features and aspects of the exemplary embodiments of the present invention will be described in detailed with reference to the accompanying drawings, in which.

DETAILED DESCRIPTION OF EXEMPLARY EMBODIMENTS

Figure 1A:
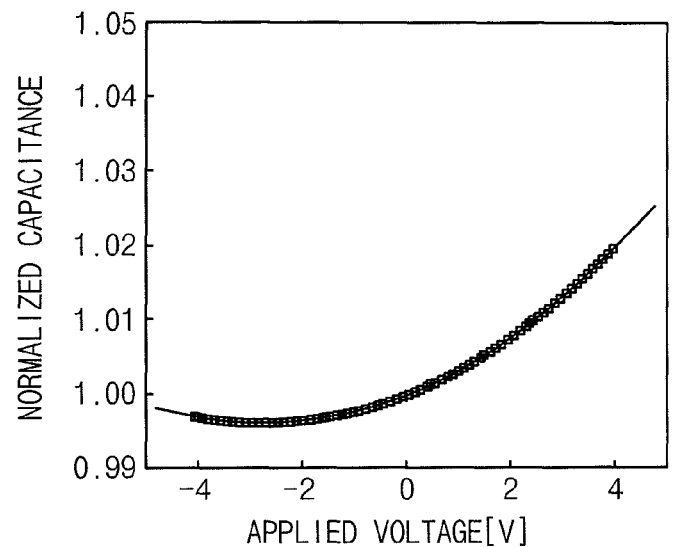
FIG. 1A is a graph illustrating the capacitance-voltage characteristics of a conventional capacitor having a high-k dielectric layer.
Figure 1B:
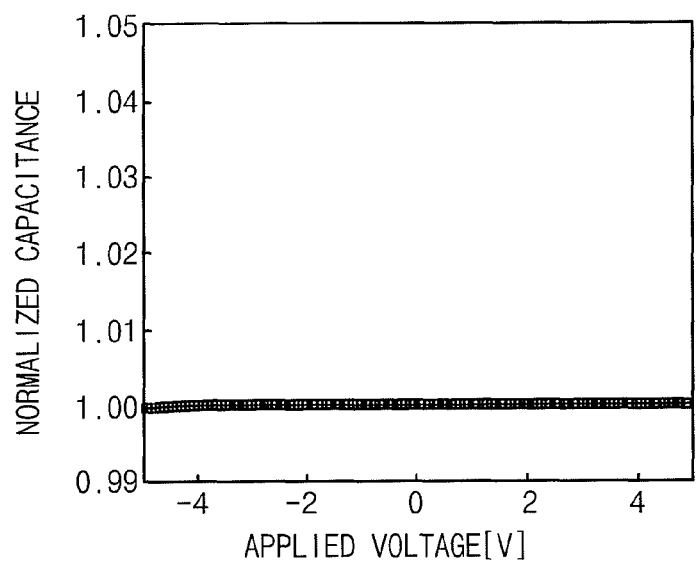
FIG. 1B is a graph illustrating the capacitance-voltage characteristics of a conventional capacitor having a low-k dielectric layer.

Exemplary embodiments of the present invention are described more fully hereinafter with reference to the accompanying drawings. The present invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, exemplary embodiments of the present invention will be explained in detail with reference to the accompanying drawings.

Figure 2:
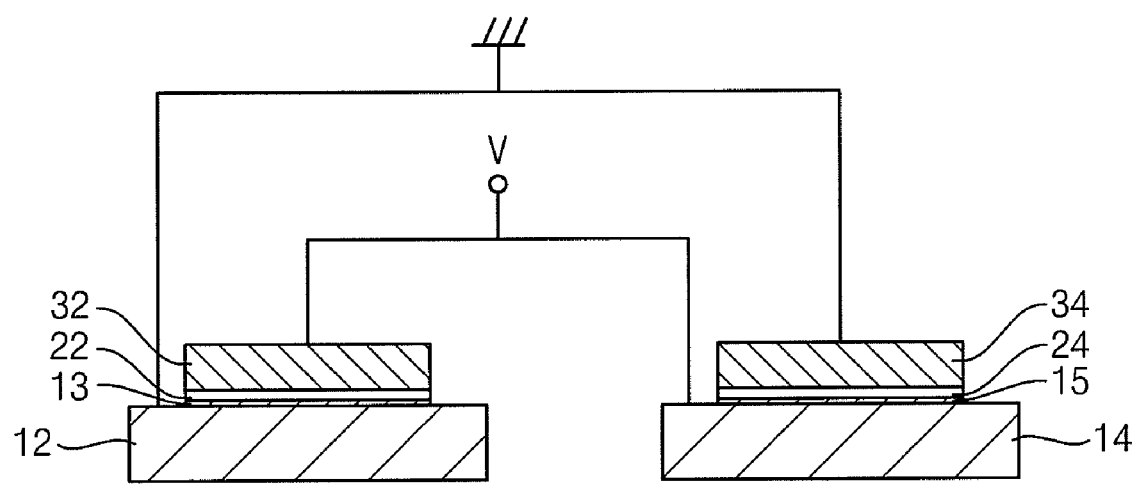
FIG. 2 is a cross-sectional view illustrating a capacitor unit in accordance with exemplary embodiments of the present invention.

FIG. 2 is a cross-sectional view illustrating a capacitor unit in accordance with exemplary embodiments of the present invention.

Referring to FIG. 2, the capacitor unit has a first capacitor and a second capacitor.

The first capacitor includes a first lower electrode 12, a first dielectric layer pattern 22 and a first upper electrode 32. Additionally, the first capacitor includes a first control layer pattern 13.

The first lower electrode 12 may include metal or metal nitride. For example, the first lower electrode 12 may include titanium, tantalum, ruthenium, tungsten, titanium nitride, titanium aluminum nitride, tantalum nitride, ruthenium nitride, tungsten nitride, etc.

The first dielectric layer pattern 22 may include metal oxide or metal oxynitride. For example, the first dielectric layer 22 may include aluminum oxide, hafnium oxide, hafnium oxynitride, etc. In an exemplary embodiment of the present invention, the first dielectric layer 22 has a multilayer structure including a hafnium oxide/hafnium carbon oxide/hafnium oxide layer structure. In an exemplary embodiment of the present invention, the first dielectric layer 22 has a multilayer structure including a hafnium oxide/hafnium carbon oxynitride/hafnium oxide layer structure.

The first upper electrode 32 may include metal or metal nitride. For example, the first upper electrode 32 may include titanium, tantalum, ruthenium, tungsten, titanium nitride, titanium aluminum nitride, tantalum nitride, ruthenium nitride, tungsten nitride, etc.

The first control layer pattern 13 is formed between the first lower electrode 12 and the first dielectric layer pattern 22.

The first control layer pattern 13 may include metal oxide or metal oxynitride. For example, the first control layer pattern 13 may include titanium oxide, tantalum oxide, ruthenium oxide, tungsten oxide, titanium tungsten oxide, titanium oxynitride, titanium aluminum oxynitride, tantalum oxynitride, ruthenium oxynitride, tungsten oxynitride, etc.

The first control layer pattern 13 may be formed by performing an oxidation process on a top surface of the first lower electrode 12. In an exemplary embodiment of the present invention, the first control layer pattern 13 is a metal oxide layer or a metal oxynitride layer that is formed by performing a plasma oxidation process on the top surface of the first lower electrode 12. In an exemplary embodiment of the present invention, the first control layer pattern 13 is a metal oxide layer or a metal oxynitride layer that is formed by annealing the top surface of the first lower electrode 12.

The first control layer pattern 13 is formed between the first lower electrode 12 and the first dielectric layer pattern 22, and the first capacitor may have a capacitance that is substantially independent of an external voltage. For example, a voltage coefficient of capacitance (VCC) of the first capacitor may have a reduced first coefficient, so that the VCC may be decreased.

The second capacitor includes a second lower electrode 14, a second dielectric layer pattern 24 and a second upper electrode 34. Additionally, the second capacitor includes a second control layer pattern 15 between the second electrode 14 and the second dielectric layer pattern 24.

The second capacitor may have a structure substantially the same as that of the first capacitor.

The first upper electrode 32 of the first capacitor is electrically connected to the second lower electrode 14 of the second capacitor, and an external voltage V is applied thereto. Additionally, the first lower electrode 12 of the first capacitor is electrically connected to the second upper electrode 34 of the second capacitor, and is grounded. Thus, the first and second capacitors are connected to each other in series, and the capacitor unit including the first and second capacitors has a total capacitance substantially the same as the sum of a first capacitance of the first capacitor and a second capacitance of the second capacitor.

The first capacitance of the first capacitor may be represented by Equation 2, and the second capacitance of the second capacitor may be represented by Equation 3.

$$C_1 = C_{01}(a_2V^2 + b_1V + 1) \qquad \text{[Equation 2]}$$

$$C_2 = C_{02}(a_2V^2 + b_2V + 1) \qquad \text{[Equation 3]}$$

Here, $C_1$ and $C_2$ refer to the first and second capacitances of the first and second capacitors, respectively, and $C_{01}$ and $C_{02}$ indicate the first and second capacitances of the first and second capacitors, respectively, when voltages have not been applied thereto.

According to Equations 2 and 3, the total capacitance of the capacitor unit may be represented by Equation 4.

$$C = C_1 + C_2 = C_{01}(a_1V^2 + b_1V + 1) + C_{02}(a_2V^2 + b_2V + 1) \qquad \text{[Equation 4]}$$

In some exemplary embodiments of the present invention, the first and second capacitors may be substantially the same, and the voltage applied to the second capacitor may have a magnitude substantially the same as that of the first capacitor and a direction opposite to that of the first capacitor. Accordingly, Equation 4 may be transformed into Equation 5.

$$C = C_1 + C_2 = 2C_0(aV^2 + 1) \qquad \text{[Equation 5]}$$

Referring to Equation 5, the second coefficients of the first and second capacitors offset each other, and thus the total second coefficient of the capacitor unit may be zero. When the first and second capacitors are not substantially the same, the total second coefficient may not be zero. However, the voltages applied to the first and second capacitors have opposite signs, thereby resulting in a very small value.

As described above, the first coefficients of the first and second capacitors have a small value due to the first and second control layer patterns 13 and 15, respectively, so that the capacitor unit may also have the small total first coefficient.

Figure 4A:
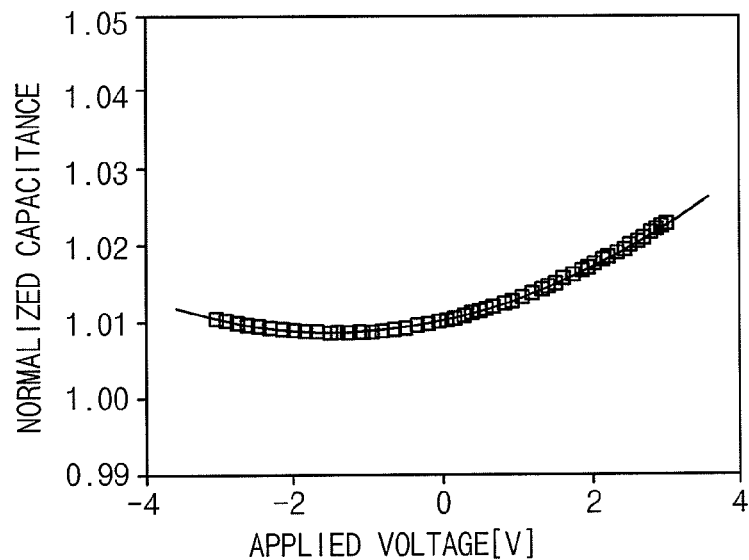
FIGS. 4A and 4B are graphs illustrating the capacitance-voltage characteristics of the capacitor unit in accordance with exemplary embodiments of the present invention.
Figure 4B:
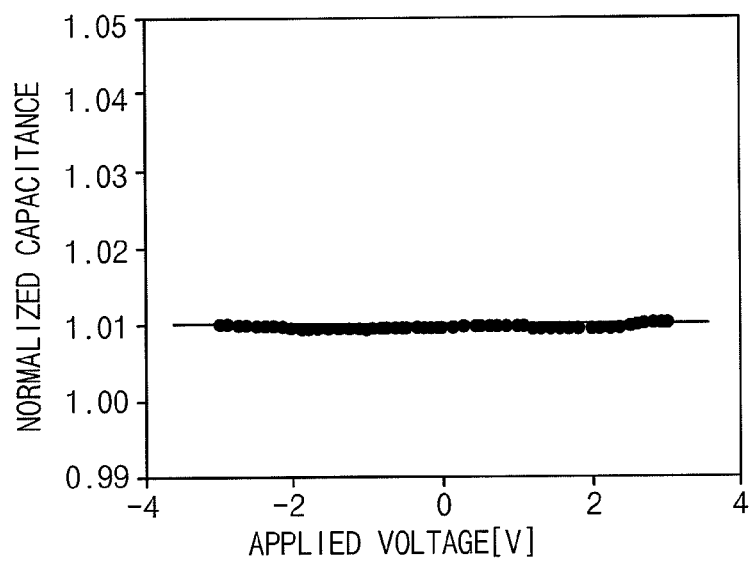

FIGS. 4A and 4B are graphs illustrating the capacitance-voltage characteristics of the capacitor unit in accordance with exemplary embodiments of the present invention. Particularly, FIG. 4A shows the capacitance-voltage characteristics of a first capacitor unit having a single capacitor in which no control layer pattern is formed, and FIG. 4B shows the capacitance-voltage characteristics of a second capacitor unit having first and second capacitors in which first and second control layer patterns are formed.

In the first capacitor unit, lower and upper electrodes including titanium nitride and a dielectric layer pattern including hafnium oxide, hafnium carbon oxide and hafnium oxide are used. The first capacitor unit has a capacitance of about 6.9 fF/$\mu$m$^2$, and a VCC of the first capacitor unit has a first coefficient of about 697 and a second coefficient of about 2,070. Meanwhile, the second capacitor unit has first and second capacitors, which are substantially the same as the capacitor of the first capacitor unit except that the first and second capacitors have half the area of that of the capacitor of the first capacitor unit. Additionally, in the second capacitor unit, the first and second control layer patterns including titanium oxynitride are formed on first and second lower electrodes, respectively, by performing a plasma treatment process on the first and second lower electrodes at a temperature of about 300° C. for about 1 minute under an oxygen atmosphere. The second capacitor unit has a capacitance of about 5.6 fF/$\mu$m$^2$, and a VCC of the second capacitor unit has a first coefficient of about 64 and a second coefficient of about 0. As a result, the second capacitor unit has a capacitance reduced from that of the first capacitor unit by about 19%; however, the VCC of the second capacitor unit has first and second coefficients reduced from those of the VCC of the first capacitor unit by about 90% and about 100%, respectively.

Figure 5A:
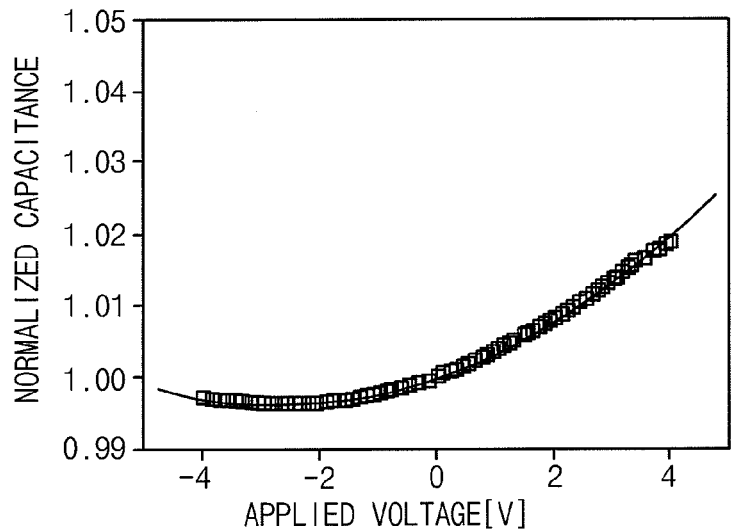
FIGS. 5A and 5B are graphs illustrating the capacitance-voltage characteristics of the capacitor unit in accordance with exemplary embodiments of the present invention.
Figure 5B:
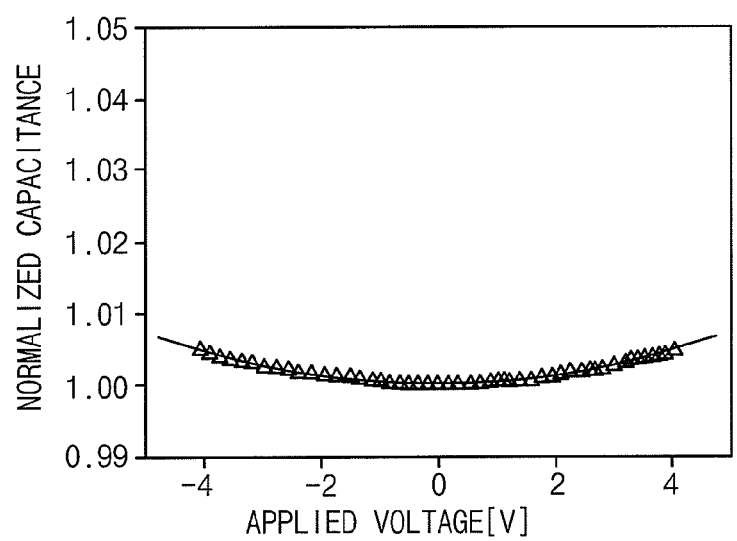

FIGS. 5A and 5B are graphs illustrating the capacitance-voltage characteristics of the capacitor unit in accordance with exemplary embodiments of the present invention. Particularly, FIG. 5A shows the capacitance-voltage characteristics of a third capacitor unit having a single capacitor in which no control layer pattern is formed, and FIG. 5B shows the capacitance-voltage characteristics of a fourth capacitor unit having third and fourth capacitors in which third and fourth control layer patterns are formed.

In the third capacitor unit, lower and upper electrodes including titanium nitride and a dielectric layer pattern including hafnium oxide, hafnium carbon oxynitride and hafnium oxide are used. The third capacitor unit has a capacitance of about 7.8 fF/$\mu$m$^2$, and a VCC of the third capacitor unit has a first coefficient of about 514 and a second coefficient of about 2,840. Meanwhile, the fourth capacitor unit has the third and fourth capacitors, which are substantially the same as the capacitor of the third capacitor unit except that the third and fourth capacitors have half an area of that of the capacitor of the third capacitor unit. Additionally, in the fourth capacitor unit, the third and fourth control layer patterns including titanium oxynitride are formed on third and fourth lower electrodes, respectively, by performing a plasma treatment process on the third and fourth lower electrodes at a temperature of about 300° C. for about 1 minute under an oxygen atmosphere. The fourth capacitor unit has a capacitance of about 7.03 fF/$\mu$m$^2$, and a VCC of the fourth capacitor unit has a first coefficient of about 285 and a second coefficient of about 3.4. As a result, the fourth capacitor unit has a capacitance reduced from that of the third capacitor unit by about 10%. However, the VCC of the fourth capacitor unit has first and second coefficients reduced from those of the VCC of the third capacitor unit by about 44% and about 100%, respectively.

Figure 3:
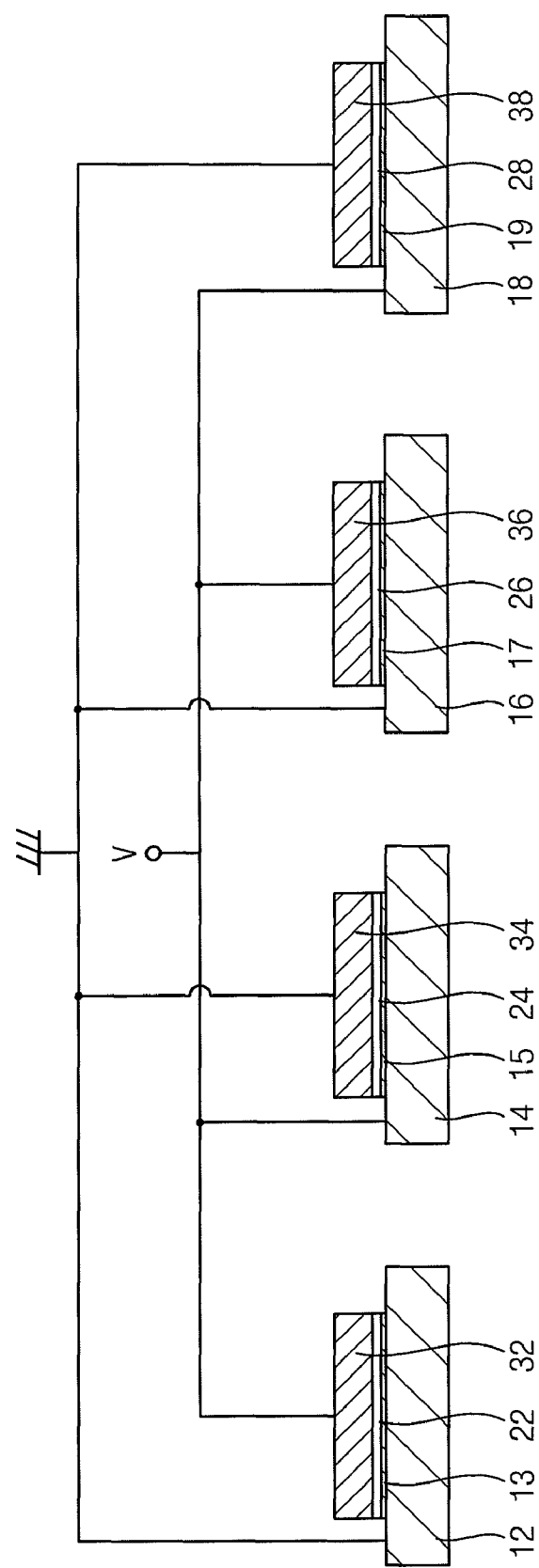
FIG. 3 is a cross-sectional view illustrating a capacitor unit in accordance with exemplary embodiments of the present invention.

FIG. 3 is a cross-sectional view illustrating a capacitor unit in accordance with exemplary embodiments of the present invention. The capacitor unit in FIG. 3 is similar to that in FIG. 2 except that the capacitor unit in FIG. 3 has four capacitors.

Referring to FIG. 3, the capacitor unit has a first capacitor set and a second capacitor set. The first capacitor set includes a first capacitor and a second capacitor, and the second capacitor set includes a third capacitor and a fourth capacitor. The first capacitor set may be substantially the same as the capacitor unit in FIG. 2, and the second capacitor set may also be substantially the same as the capacitor unit in FIG. 2. The first capacitor set includes the first and second capacitors.

The first capacitor includes a first lower electrode 12, a first dielectric layer pattern 22 and a first upper electrode 32. The first capacitor further includes a first control layer pattern 13. The second capacitor includes a second lower electrode 14, a second dielectric layer pattern 24 and a second upper electrode 34. The second capacitor further includes a second control layer pattern 15.

The first upper electrode 32 of the first capacitor is electrically connected to the second lower electrode 14 of the second capacitor, and an external voltage V is applied thereto. Additionally, the first lower electrode 12 of the first capacitor is electrically connected to the second upper electrode 34 of the second capacitor, and is grounded.

The second capacitor set includes the third and fourth capacitors.

The third capacitor includes a third lower electrode 16, a third dielectric layer pattern 26 and a third upper electrode 36. The third capacitor further includes a third control layer pattern 17. The fourth capacitor includes a fourth lower electrode 18, a fourth dielectric layer pattern 28 and a fourth upper electrode 38. The fourth capacitor further includes a fourth control layer pattern 19.

The third upper electrode 36 of the third capacitor is electrically connected to the fourth lower electrode 18 of the fourth capacitor, and the external voltage V is applied thereto. Additionally, the third lower electrode 16 of the third capacitor is electrically connected to the fourth upper electrode 38 of the fourth capacitor, and is grounded.

Meanwhile, the first and second capacitor sets are connected in series to each other. That is, the first upper electrode 32, the second lower electrode 14, the third upper electrode 36 and the fourth lower electrode 18 to which the external voltage V is applied are electrically connected to each other. Additionally, the first lower electrode 12, the second upper electrode 34, the third lower electrode 16 and the fourth upper electrode 38 that are grounded are electrically connected to each other. Accordingly, the capacitor unit may have a total capacitance substantially the same as the sum of first, second, third and fourth capacitances of the first, second, third and fourth capacitors, respectively.

As described above, a VCC of the capacitor unit may have a small total first coefficient due to the first to fourth control layer patterns 13, 15, 17 and 19, and a very small total second coefficient because VCCs of the first and second capacitor sets may have a very small second coefficient. Thus, the capacitor may have a small VCC.

The capacitor unit having two capacitors or four capacitors has been described above with reference to FIG. 2 or FIG. 3; however, other capacitor units having an even number of capacitors, which are coupled in pairs, may be included within the scope of the present invention. For example, in a capacitor unit having a given capacitance, when the capacitor unit is divided into 2n (n is a natural number) capacitors having substantially the same area are connected in series as above, and a control layer pattern is formed on each lower electrode, the capacitor unit may have a small VCC.

FIGS. 6A to 6I are cross-sectional views illustrating a method of forming a capacitor unit in accordance with exemplary embodiments of the present invention.

Figure 6A:
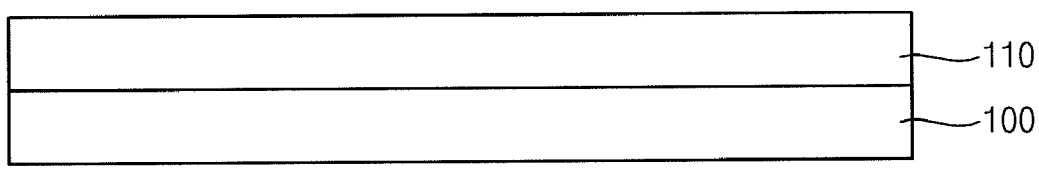
FIGS. 6A to 6I are cross-sectional views illustrating a method of forming a capacitor unit in accordance with exemplary embodiments of the present invention.

Referring to FIG. 6A, a first insulating interlayer 110 is formed on a substrate 100.

The substrate 100 may include a silicon substrate, a germanium substrate, a silicon-germanium substrate, a silicon-on-insulator (SOI) substrate, a germanium-on-insulator (GOI) substrate, etc.

Figure 6B:
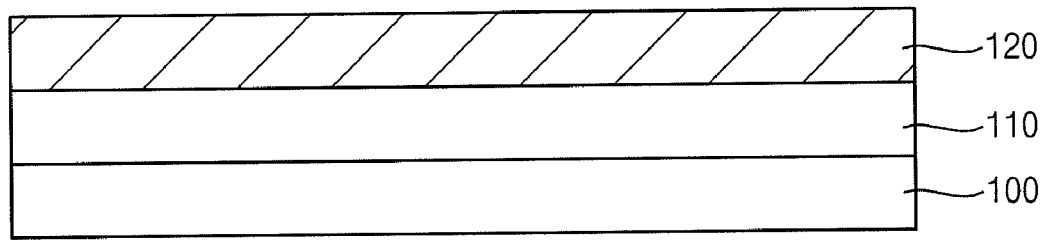

The first insulating interlayer 110 may be formed using one or more of an oxide, silicon oxide, etc. Referring to FIG. 6B, a lower conductive layer 120 is formed on the first insulating interlayer 110.

The lower conductive layer 120 may be formed using one or more of titanium, tantalum, ruthenium, tungsten, titanium nitride, titanium aluminum nitride, tantalum nitride, ruthenium nitride, tungsten nitride, etc. The lower conductive layer 120 may be formed by a chemical vapor deposition (CVD) process, an atomic layer deposition (ALD) process, a plasma-enhanced atomic layer deposition (PEALD) process, etc. In an exemplary embodiment of the present invention, the lower conductive layer 120 is formed by a metal organic chemical vapor deposition (MOCVD) process using tetrakis dimethylamino titanium (TDMAT) source.

Figure 6C:
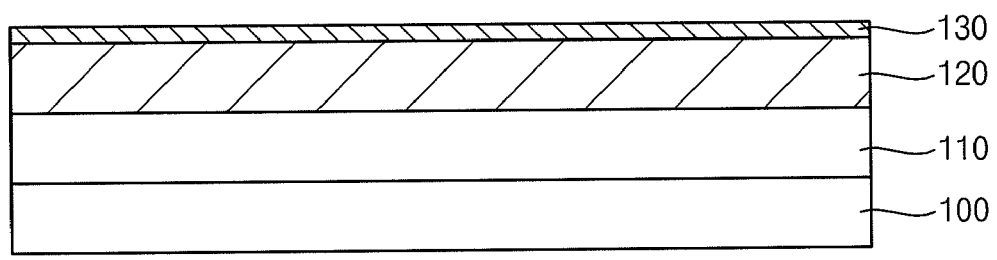

Referring to FIG. 6C, a control layer 130 is formed on the lower conductive layer 120.

The control layer 130 may be formed using one or more of titanium oxide, tantalum oxide, ruthenium oxide, tungsten oxide, titanium tungsten oxide, titanium oxynitride, titanium aluminum oxynitride, tantalum oxynitride, ruthenium oxynitride, tungsten oxynitride, etc.

The control layer 130 may be formed by performing an oxidation process on a top surface of the lower conductive layer 120.

In an exemplary embodiment of the present invention, the control layer 130 may be formed by performing a plasma treatment process on the top surface of the lower conductive layer 120 at a temperature below about 475° C. within about 5 minutes under an oxygen, ozone or nitrous oxide atmosphere.

In an exemplary embodiment of the present invention, the control layer 130 may be formed by annealing the top surface of the lower conductive layer 120 at a temperature below about 475° C. for about 5 minutes under an oxygen, ozone or nitrous oxide atmosphere.

Figure 6D:
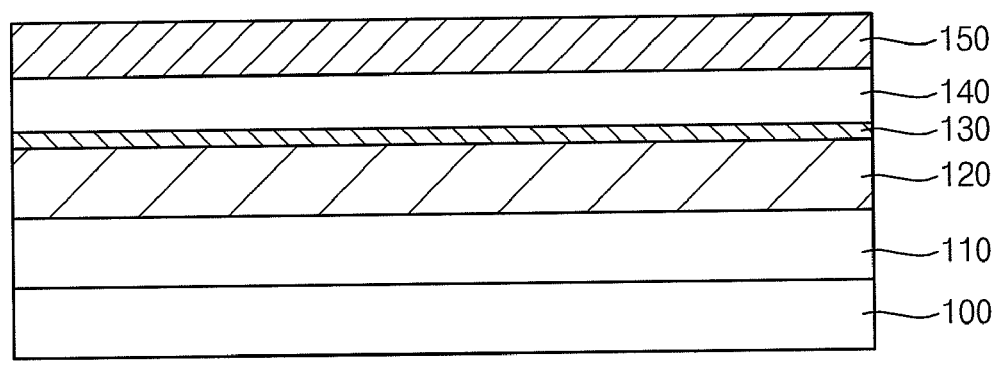

Referring to FIG. 6D, a dielectric layer 140 and an upper conductive layer 150 are sequentially formed on the control layer 130.

The dielectric layer 140 may be formed using metal oxide or metal oxynitride having a high dielectric constant. For example, the dielectric layer 140 may be formed using one or more of aluminum oxide, hafnium oxide, hafnium oxynitride, etc. In an exemplary embodiment of the present invention, the dielectric layer 140 may be formed by sequentially depositing hafnium oxide, hafnium carbon oxide and hafnium oxide on the control layer 130. In an exemplary embodiment of the present invention, the dielectric layer 140 may be formed by sequentially depositing hafnium oxide, hafnium carbon oxynitride and hafnium oxide on the control layer 130. The dielectric layer 140 may be formed by an ALD process, a PEALD process, a CVD process, etc.

The upper conductive layer 150 may be formed using one or more of titanium, tantalum, ruthenium, tungsten, titanium nitride, titanium aluminum nitride, tantalum nitride, ruthenium nitride, tungsten nitride, etc. The upper conductive layer 150 may be formed by using a CVD process, an ALD process, a PEALD process, etc. In an exemplary embodiment of the present invention, the upper conductive layer 150 is formed by an MOCVD process using TDMAT source.

Figure 6E:
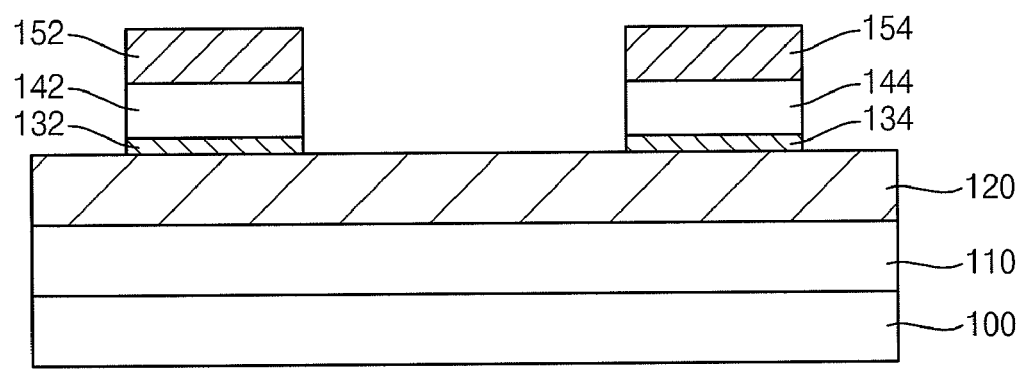

Referring to FIG. 6E, the upper conductive layer 150, the dielectric layer 140 and the control layer 130 are partially removed by a photolithography process to form first and second control layer patterns 132 and 134, first and second dielectric layer patterns 142 and 144, and first and second upper electrodes 152 and 154 on the lower conductive layer 120.

Figure 6F:
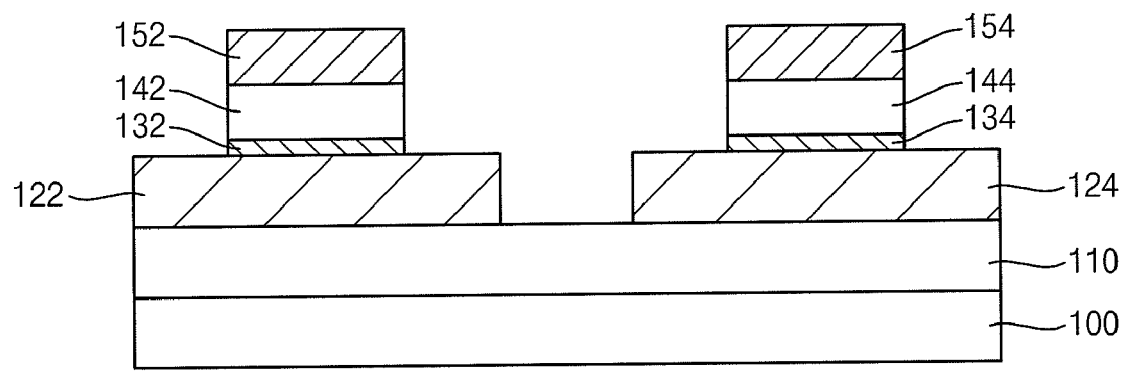

Referring to FIG. 6F, the lower conductive layer 120 is partially removed by a photolithography process to form first and second lower electrodes 122 and 124 on the first insulating interlayer 110. Thus, a first capacitor including the first lower electrode 122, the first control layer pattern 132, the first dielectric layer pattern 142 and the first upper electrode 152, and a second capacitor including the second lower electrode 124, the second control layer pattern 134, the second dielectric layer pattern 144 and the second upper electrode 154 are formed.

Figure 6G:
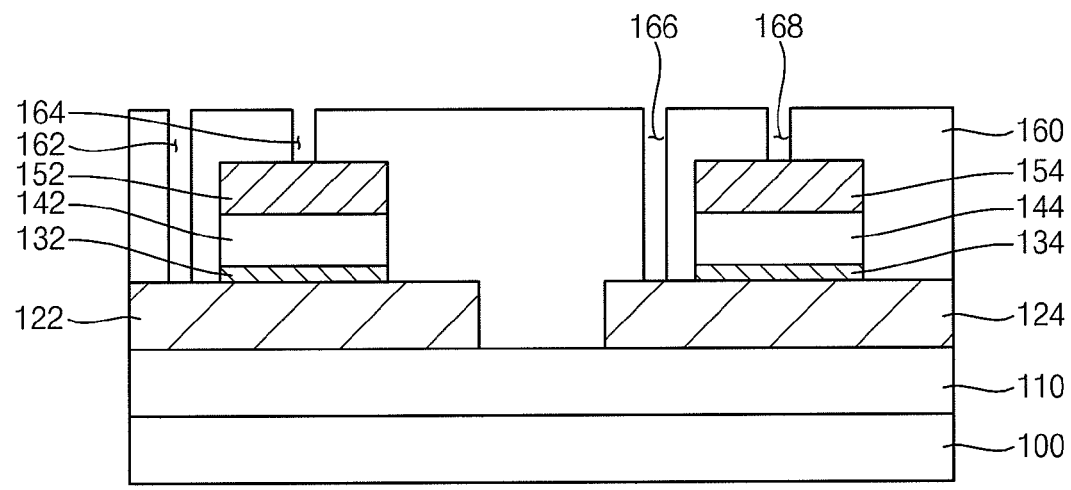

Referring to FIG. 6G, a second insulating interlayer 160 is formed on the first insulating interlayer 110 to cover the first and second capacitors. The second insulating interlayer 160 has first and second openings 162 and 164 exposing the first lower and upper electrodes 122 and 152, respectively, and third and fourth openings 166 and 168 exposing the second lower and upper electrodes 124 and 154, respectively. The second insulating interlayer 160 may be formed using an oxide or silicon oxide.

Figure 6H:
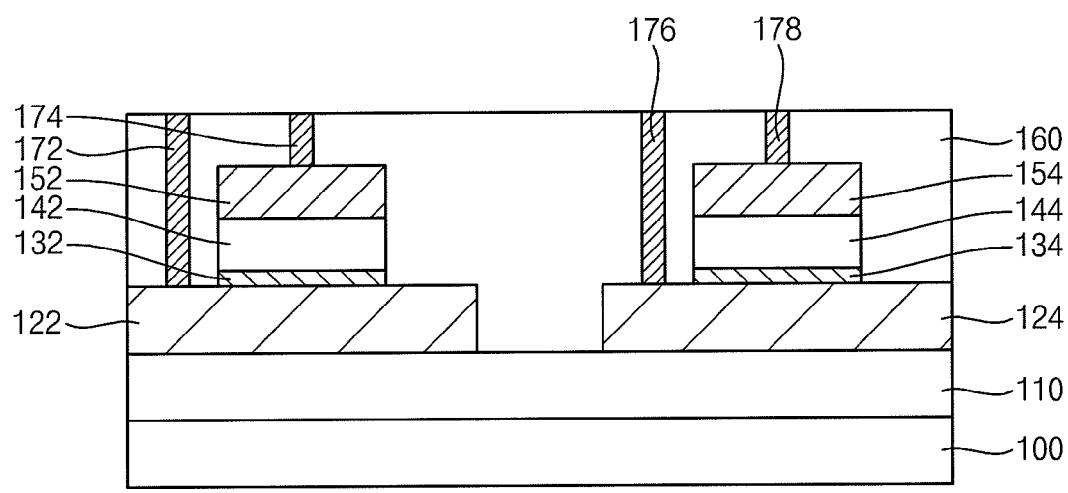

Referring to FIG. 6H, first, second, third and fourth plugs 172, 174, 176 and 178 filling up the first, second, third and fourth openings 162, 164, 166 and 168, respectively, are formed. The first to fourth plugs 172, 174, 176 and 178 may be formed by a CVD process, a sputtering process, an ALD process, an electron beam deposition (EBD) process, a pulsed laser deposition (PLD) process, etc., using metal, conductive metal nitride, doped polysilicon, etc.

Figure 6I:
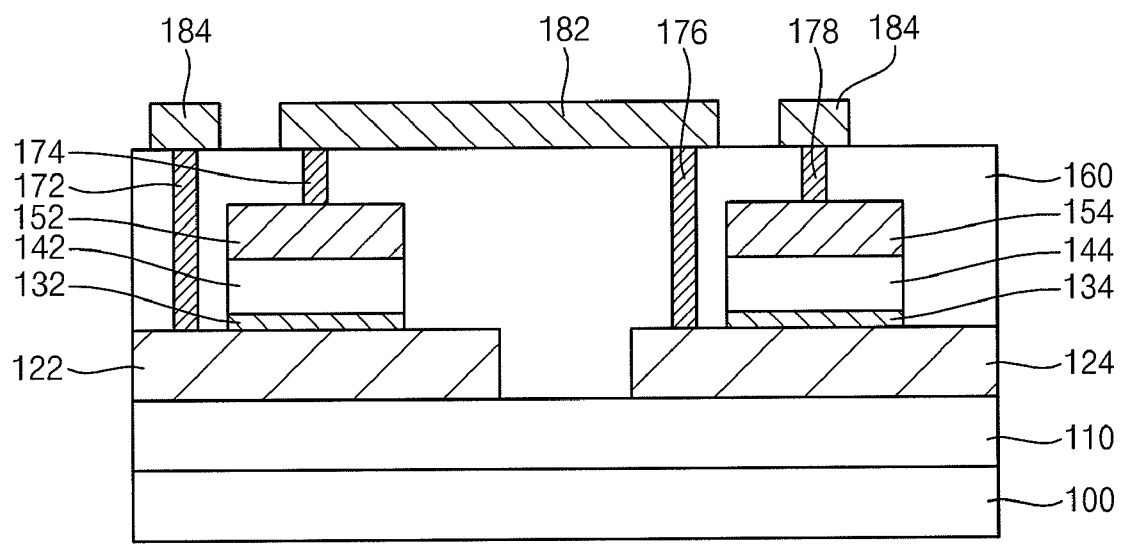

Referring to FIG. 6I, first and second wirings 182 and 184 are formed on the first to fourth plugs 172, 174, 176 and 178 and the second insulating interlayer 160. The first and second wirings 182 and 184 may be formed by a CVD process, a sputtering process, an ALD process, an EBD process, a PLD process, etc., using a metal, a conductive metal nitride, a doped polysilicon, etc.

The first wiring 182 is electrically connected to the first upper electrode 152 and the second lower electrodes 124 via the second and third plugs 174 and 176, respectively, and a voltage may be applied thereto. The second wiring 184 is electrically connected to the first lower electrode 122 and the second upper electrode 154 via the first and fourth plugs 172 and 178, respectively, and may be grounded.

By performing the above processes, the capacitor unit in accordance with exemplary embodiments of the present invention may be formed.

According to exemplary embodiments of the present invention, a VCC of a capacitor may have a reduced first coefficient by forming a control layer pattern on a lower electrode, and a reduced second coefficient by connecting a plurality of capacitors in series. Thus, a capacitor having a small VCC may be formed. The control layer pattern may be easily formed by oxidizing the lower electrode.

Although exemplary embodiments of the present invention have been described herein, those skilled in the art will readily appreciate that many modifications are possible without materially departing from the present invention.

What is claimed is:

1. A capacitor unit comprising:
   a first capacitor in which a first lower electrode, a first dielectric layer pattern and a first upper electrode are sequentially stacked, the first capacitor including a first control layer pattern formed between the first lower electrode and the first dielectric layer pattern; and
   a second capacitor in which a second lower electrode, a second dielectric layer pattern and a second upper electrode are sequentially stacked, the second lower electrode being electrically connected to the first upper electrode, the second upper electrode being electrically connected to the second lower electrode, the second capacitor including a second control layer pattern formed between the second lower electrode and the second dielectric layer pattern.

2. The capacitor unit of claim 1, wherein the first control layer pattern controls a voltage coefficient of capacitance (VCC) of the first capacitor and the second control layer pattern controls a VCC of the second capacitor.

3. The capacitor unit of claim 1, wherein the first and second lower electrodes include metal or metal nitride, and the first and second control layer patterns include metal oxide or metal oxynitride.

4. The capacitor unit of claim 1, wherein the first and second lower electrodes comprise one or more of titanium oxide, tantalum oxide, ruthenium oxide, tungsten oxide, titanium tungsten oxide, titanium oxynitride, titanium aluminum oxynitride, tantalum oxynitride, ruthenium oxynitride, or tungsten oxynitride.

5. The capacitor unit of claim 1, wherein the first and second control layer patterns include metal or metal nitride, and the first and second control layer patterns include metal oxide or metal oxynitride.

6. The capacitor unit of claim 1, wherein the first and second dielectric layer patterns have a multilayer structure in which a hafnium oxide layer, a hafnium carbon oxide layer and a hafnium oxide layer are sequentially stacked.

7. The capacitor unit of claim 1, wherein the first and second dielectric layer patterns have a multilayer structure in which a hafnium oxide layer, a hafnium carbon oxynitride layer and a hafnium oxide layer are sequentially stacked.

8. A capacitor unit comprising:
   a plurality of capacitor sets, each of which includes:
   a first capacitor in which a first lower electrode, a first dielectric layer pattern and a first upper electrode are sequentially stacked, the first capacitor including a first control layer pattern formed between the first lower electrode and the first dielectric layer pattern; and
   a second capacitor in which a second lower electrode, a second dielectric layer pattern and a second upper electrode are sequentially stacked, the second lower electrode being electrically connected to the first upper electrode, the second upper electrode being electrically connected to the second lower electrode, the second capacitor including a second control layer pattern formed between the second lower electrode and the second dielectric layer pattern,
   one or more of the first upper electrodes and one or more of the second lower electrodes are not grounded and are electrically connected to each other.

9. The capacitor unit of claim 8, wherein the first control layer pattern controls a VCC of the first capacitor and the second control layer pattern controls a VCC of the second capacitor.

10. The capacitor unit of claim 8, wherein the first and second lower electrodes include metal or metal nitride, and the first and second control layer patterns include metal oxide or metal oxynitride.

11. The capacitor unit of claim 8, wherein the first and second lower electrodes comprise one or more of titanium oxide, tantalum oxide, ruthenium oxide, tungsten oxide, titanium tungsten oxide, titanium oxynitride, titanium aluminum oxynitride, tantalum oxynitride, ruthenium oxynitride, or tungsten oxynitride.

12. The capacitor unit of claim 8, wherein the first and second control layer patterns include metal or metal nitride, and the first and second control layer patterns include metal oxide or metal oxynitride.

13. The capacitor unit of claim 8, wherein the first and second dielectric layer patterns have a multilayer structure in which a hafnium oxide layer, a hafnium carbon oxide layer and a hafnium oxide layer are sequentially stacked.

14. The capacitor unit of claim 8, wherein the first and second dielectric layer patterns have a multilayer structure in which a hafnium oxide layer, a hafnium carbon oxynitride layer and a hafnium oxide layer are sequentially stacked.

15. A method of forming a capacitor unit, comprising:
   forming first and second lower electrodes on a substrate;
   forming first and second control layer patterns on the first and second lower electrodes, the first and second control layer patterns controlling a VCC of the capacitor;
   forming first and second dielectric layer patterns on the first and second control layer patterns;
   forming first and second upper electrodes on the first and second dielectric layer patterns; and
   forming first and second wirings, the first wiring electrically connecting the first upper electrode to the second lower electrode, and the second wiring electrically connecting the first lower electrode to the second upper electrode.

16. The method of claim 15, wherein forming the first and second control layer patterns includes performing an oxidation process on the first and second lower electrodes.

17. The method of claim 16, wherein the oxidation process comprises a plasma treatment performed under an oxygen, ozone or nitrous oxide atmosphere.

18. The method of claim 17, wherein the plasma treatment is performed at a temperature below about 475° C. within about 5 minutes.

19. The method of claim 16, wherein the oxidation process comprises an annealing performed under an oxygen, ozone or nitrous oxide atmosphere at a temperature below about 475° C. for about 5 minutes.

20. The method of claim 15, wherein forming the dielectric layer patterns comprises performing an atomic layer deposition (ALD) process, a plasma-enhanced atomic layer deposition (PEALD) process or a chemical vapor deposition (CVD) process.

* * * * *